(12) United States Patent
Fujii et al.

(10) Patent No.: US 8,447,582 B2
(45) Date of Patent: May 21, 2013

(54) VARIATION DISTRIBUTION SIMULATION APPARATUS AND METHOD, AND RECORDING MEDIUM

(75) Inventors: Fumie Fujii, Yokohama (JP); Sadayuki Yoshitomi, Tokyo (JP); Naoki Wakita, Kawasaki (JP); Yuka Itano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 524 days.

(21) Appl. No.: 12/730,158

(22) Filed: Mar. 23, 2010

(65) Prior Publication Data
US 2011/0077917 A1    Mar. 31, 2011

(30) Foreign Application Priority Data
Sep. 25, 2009    (JP) ................................. 2009-221388

(51) Int. Cl.
*G06F 17/50* (2006.01)
(52) U.S. Cl.
USPC .......................................................... 703/14
(58) Field of Classification Search
USPC ......... 703/14, 13; 438/270; 716/2, 4; 700/47; 327/109; 257/401, 402
See application file for complete search history.

(56) References Cited

U.S. PATENT DOCUMENTS

| | | | |
|---|---|---|---|
| 2002/0156609 A1 | 10/2002 | Hirata et al. | |
| 2006/0189082 A1* | 8/2006 | Vogelsang | 438/270 |
| 2006/0190863 A1* | 8/2006 | Axelrad et al. | 716/4 |
| 2008/0140229 A1* | 6/2008 | Nishinohara et al. | 700/47 |
| 2008/0157223 A1* | 7/2008 | Teo et al. | 257/401 |
| 2008/0195983 A1* | 8/2008 | Chidambarrao et al. | 716/2 |
| 2008/0290911 A1* | 11/2008 | Williams | 327/109 |
| 2009/0119085 A1* | 5/2009 | Ma et al. | 703/14 |

FOREIGN PATENT DOCUMENTS

| | | |
|---|---|---|
| JP | 06-215059 | 5/1994 |
| JP | 09-106416 | 4/1997 |
| JP | 2002-318829 | 10/2002 |

OTHER PUBLICATIONS

Kondo et al., "A systematic and physical application of Multivariate statistics to MOSFET I-V models", IEEE 1999.*
Kondo et al., "Model adaptable MOSFET parameter extraction method using common intermediate model", IEEE 2994.*
Fujita et al., "Statistical delay calculation with vector synthesis model", IEEE 2000.*

(Continued)

*Primary Examiner* — Kandasamy Thangavelu
(74) *Attorney, Agent, or Firm* — Knobbe Martens Olson & Bear LLP (57) ABSTRACT

A circuit simulation apparatus according to an embodiment of the present invention calculates a set value of a SPICE parameter of a MOSFET to carry out a variation analysis on a semiconductor circuit including the MOSFET. The apparatus includes a storage part configured to store an intermediate model expression that includes a variable related to a manufacture condition or device structure of the MOSFET as a variable affecting variation characteristics of the MOSFET, the intermediate model expression being formed with a universal function having a physical correlation between a physical amount defined by the variable and the SPICE parameter, a setting part configured to set information about the variable included in the intermediate model expression, a calculation part configured to calculate the set value of the SPICE parameter by using the information set in the setting part and the intermediate model expression stored in the storage part, and an output part configured to output process variation dependency of the semiconductor circuit.

20 Claims, 9 Drawing Sheets

OTHER PUBLICATIONS

Yoshitomi et al., "An accurate prediction of high-frequency circuit behavior", Journal of Telecommunication and Information Technology, Jan. 2005.*

Kondo et al., "Model-Adaptable MOSFET Parameter-Extraction Method Using an Intermediate Model" IEEE Transactions on Computer-Aided Design of Integrated Circuits and Systems, vol. 17, No. 5, May 1998.

Japanese Office Action for application 2009-221388 dated Dec. 13, 2011.

Notification of Reason for Rejection for Japanese Application JP 2009-221388, mailed Aug. 3, 2012.

Stolk, et al., "Modeling Statistical Dopant Fluctuations in MOS Transistors", IEEE Transactions on Electron Devices, Sep. 1998, vol. 45, No. 9, pp. 1960-1971.

* cited by examiner

| DFM FUNCTION | BSIM4 | CORRESPONDING MOSFET CHARACTERISTICS |
|---|---|---|
| $K\_VTH0 \equiv \dfrac{T_{ox}}{T_{ox0}} \cdot \left(\dfrac{N_{DEP}}{N_{DEP0}}\right)^{\frac{1}{4}} \cdot \sqrt{\dfrac{W_0 \cdot L_0}{W \cdot L}}$ | Vth0 | Vth |
| $K\_ID \equiv (K\_VTH0/K\_Nfactor)^2$ | Idr0 | Idr |
| $K\_VSAT \equiv \begin{cases} ue = 7022.7 - 160 \times \log(N_{DEP}/1.3) \\ uh = 1908.8 - 41.81 \times \log(N_{DEP}) \end{cases}$ | u0 | LOW-FIELD MOBILITY |
| $K\_GAMMA \equiv \dfrac{T_{ox}}{T_{ox0}} \sqrt{\dfrac{N_{DEP}}{N_{DEP0}}}$ | Gamma | SUBSTRATE BIAS EFFECT |
| $K\_K1 \equiv \dfrac{\sqrt{2V_T\{\ln(N_{DEP}) - \ln(n_i)\}}}{\sqrt{2V_T\{\ln(N_{DEP0}) - \ln(n_i)\}}}$ | K1 | SUBSTRATE BIAS EFFECT |
| $K\_NFACTOR \equiv \sqrt{\dfrac{N_{DEP0}}{N_{DEP}}} \cdot \dfrac{T_{ox0}}{T_{ox}} \cdot K\_K1$ | NFACTOR | SUBSTRATE FACTOR |
| $K\_RG \equiv \dfrac{R_{GSH}}{R_{GSH0}}$ | RSHG | GATE INPUT RESISTANCE |
| $K\_RSUB \equiv \dfrac{R_{SUBSH}}{R_{SUBSH0}}$ | (SEE *1) | SUBSTRATE RESISTANCE |
| $K\_CML \equiv \sqrt{\dfrac{T_{ox}}{T_{ox0}} \cdot \dfrac{X_j}{X_{j0}}}$ | PCLM PDIBLCB | DIBL AND CML |

(*1) RBPS,RBPS0,RBPD,RBPD0,
RBSB,RBSBX0,RBSBY0,
RBPB,RBPBX0,RBPBY0,
RBDB,RBDBX0,RBDBY0,

FIG. 5

| DFM FUNCTION | BSIM4 | CORRESPONDING MOSFET CHARACTERISTICS |
|---|---|---|
| $K\_OV \equiv \dfrac{ThicknessD15}{ThicknessD15_0}$ | CGDO CGSO | EXTERNAL CAPACITANCE BETWEEN G-D, G-S |
| $KCGB \equiv \dfrac{NeckK}{NeckK\_default}$ | CGBO | EXTERNAL CAPACITANCE BETWEEN G-B |
| $K\_CJ \equiv \sqrt{\dfrac{N_{DEP}}{N_{DEP0}} \cdot \dfrac{1}{K\_PB}}$ | CJ | P/N JUNCTION CAPACITANCE BETWEEN AA AND WELL |
| $K\_PB \equiv \dfrac{\ln N_D + \ln N_{DEP} - 2\ln n_i}{\ln N_D + \ln N_{DEP0} - 2\ln n_i}$ | PB | JUNCTION BUILT-IN POTENTIAL BETWEEN AA AND WELL |
| $K\_DLC \equiv \left(\dfrac{\mu_0}{\mu_1}\right)\left(\dfrac{L_1}{L_0}\right)^2$ | DLC | CUTOFF FREQUENCY |
| $K\_KF \equiv \dfrac{\mu}{\mu_0} \cdot \dfrac{T_{ox0}}{T_{ox}}$ | KF | FLICKER NOISE |
| $K\_FC \equiv K\_NFACTOR \cdot \left(\dfrac{T_{ox}}{T_{ox0}}\right)^2 \cdot K\_ID \cdot K\_KF \cdot W\_CORRPERCENT \cdot L\_CORRPERCENT$ | FC | FLICKER NOISE |
| $L\_CORRPERCENT \equiv \dfrac{L}{L_0}$ | L | GATE LENGTH |
| $W\_CORRPERCENT \equiv \dfrac{W}{W_0}$ | W | GATE WIDTH |

FIG. 6

P1: SETTING OF NOMINAL VALUE OF VARIABLE
```
+Ndep=1.7e+17
+Tox=2.39e−7
+LCORR_PERCENT_N=1e−3
+WCORR_PERCENT_N=1e−3
+rho=RGate=10
```

P2: SETTING OF VARIATION OF VARIABLE
```
statistics{
  process{
    vary N_dep    dist=gauss std=11 percent=yes
    vary T_ox     dist=gauss std=2  percent=yes
    vary LCORR_PERCENT_N dist=gauss std=1 percent=yes
    vary WCORR_PERCENT_N dist=gauss std=1 percent=yes
    vary rho_RGate dist=gauss std=0.1 percent=yes
  }
}
```

P3:
```
+toxe=2.39E−009*(T_oxN/T_oxN0)
+toxm=2.39E−009*(T_oxN/T_oxN0)
+ndep=1.7E+017*(N_depN/N_depN0)
+vth0=0.05602*K_VTH0
+k1=0.1127*K_GAMMA
+u0=474.3*K_vsat
+vsat=158000*K_vsat
+nfactor=2.527*K_Nfactor
+pclm=0.2706*K_CML
+pdiblc1=0.3564*K_CML
+pdiblc2=0.001858*K_CML
+rdsw=78.77*K_RDSW
+lint=−1E−008*L_CORRPERCENT
+wint=1.8E−008*W_CORRPERCENT
+cgso=1.5E−010*K_LOV
+cgdo=1.5E−010*K_LOV
+cgbo=0*K_CGB
+cjs=0.0007847*K_CJ
+cjsws=4.13E−011
+pbs=0.4556*K_PB
```

VARIATION DISTRIBUTION SIMULATION APPARATUS AND METHOD, AND RECORDING MEDIUM

CROSS REFERENCE TO RELATED APPLICATION

This application is based upon and claims the benefit of priority from the prior Japanese Patent Application No. 2009-221388, filed on Sep. 25, 2009, the entire contents of which are incorporated herein by reference.

BACKGROUND OF THE INVENTION

1. Field of the Invention

The present invention relates to a variation distribution simulation apparatus and method and a recording medium, for example, to model parameters to be used in a SPICE (Simulation Program with Integrated Circuit Emphasis) circuit simulation, and more particularly, to calculations of parameters to be used to analyze variations and sensitivities of MOSFET circuits.

2. Background Art

In the field of semiconductor technology, a variation analysis is normally carried out through a SPICE circuit simulation in the final stage of circuit design, so as to optimize circuits with respect to the yield rate.

However, the conventional variation simulation has the following problems.

For example, in a Principle Component Monitor model, significant intermediate variables are extracted from actual variation data, and a model is formed with polynomial expressions of the intermediate variables. To realize this, however, vast numbers of tests need to be conducted, and complicated statistical procedures need to be carried out. As a result, a large number of development procedures are required.

JP-A H9-106416 (KOKAI) discloses a technique by which the variation of a threshold voltage $V_{TH}$ as a SPICE parameter of MOSFETs is expressed with a thickness $T_{OX}$ of a gate insulator, so as to express the variations of the MOSFETs. However, this is not enough to express the actual variations of the MOSFETs. Particularly, this is insufficient for the design of analog RF (radio-frequency) circuits that are required to have high precision.

According to the reference "M. Kondo et al., "Model-Adaptable MOSFET Parameter-Extraction Method Using an Intermediate Model", IEEE Transactions on Computer-Aided Design of Integrated Circuits and Systems, pp. 400-405, Vol. 17, No. 5, May 1998", a statistical model of a MOSFET is generated by using an intermediate model, and the threshold voltage $V_{TH}$ and the like are used as intermediate variables. The intermediate model is generated by using the data about the I-V characteristics of MOSFETs. However, a certain period of time is required to generate the intermediate model, and the circuit characteristics varying with the process variation cannot be directly observed.

SUMMARY OF THE INVENTION

An aspect of the present invention is, for example, a circuit simulation apparatus that calculates a set value of a SPICE parameter of a MOSFET to carry out a variation analysis on a semiconductor circuit including the MOSFET, the apparatus including a storage part configured to store an intermediate model expression that includes a variable related to a manufacture condition or device structure of the MOSFET as a variable affecting variation characteristics of the MOSFET, the intermediate model expression being formed with a universal function having a physical correlation between a physical amount defined by the variable and the SPICE parameter, a setting part configured to set information about the variable included in the intermediate model expression, a calculation part configured to calculate the set value of the SPICE parameter by using the information set in the setting part and the intermediate model expression stored in the storage part, and an output part configured to output process variation dependency of the semiconductor circuit.

Another aspect of the present invention is, for example, a circuit simulation method for calculating a set value of a SPICE parameter of a MOSFET to carry out a variation analysis on a semiconductor circuit including the MOSFET, the method including preparing an information processing apparatus that stores an intermediate model expression that includes a variable related to a manufacture condition or device structure of the MOSFET as a variable affecting variation characteristics of the MOSFET, the intermediate model expression being formed with a universal function having a physical correlation between a physical amount defined by the variable and the SPICE parameter, setting information about the variable included in the intermediate model expression into the information processing apparatus, calculating the set value of the SPICE parameter with the information processing apparatus by using the information and the intermediate model expression, and outputting process variation dependency of the semiconductor circuit.

Another aspect of the present invention is, for example, a computer readable recording medium storing a computer program for causing a computer to implement a circuit simulation method for calculating a set value of a SPICE parameter of a MOSFET to carry out a variation analysis on a semiconductor circuit including the MOSFET, the method including reading, from a storage part, an intermediate model expression that includes a variable related to a manufacture condition or device structure of the MOSFET as a variable affecting variation characteristics of the MOSFET, the intermediate model expression being formed with a universal function having a physical correlation between a physical amount defined by the variable and the SPICE parameter, reading, from a setting part, information about the variable included in the intermediate model expression, calculating the set value of the SPICE parameter by using the information read from the setting part and the intermediate model expression read from the storage part, and outputting process variation dependency of the semiconductor circuit.

DESCRIPTION OF THE EMBODIMENTS

Embodiments of the present invention will be described below with reference to the accompanying drawings.

First Embodiment

Figure 1:
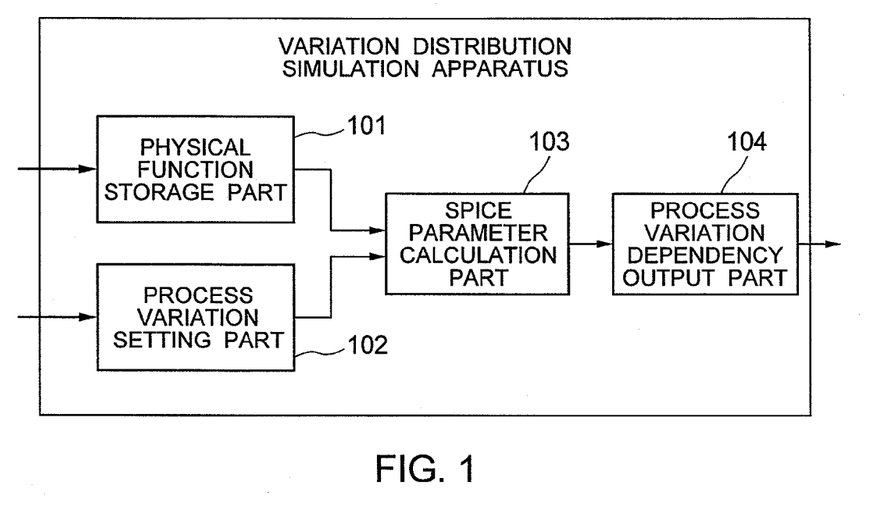
FIG. 1 is a block diagram showing a configuration of a circuit simulation apparatus according to a first embodiment.

FIG. 1 is a block diagram showing a configuration of a circuit simulation apparatus according to a first embodiment.

The circuit simulation apparatus of FIG. 1 is configured to calculate SPICE parameters to be used for variation circuit simulations (variation distribution simulation apparatus).

The circuit simulation apparatus of FIG. 1 is configured to calculate set values of SPICE parameters of MOSFETs, to carry out a variation analysis on semiconductor circuits including the MOSFETs. The apparatus of FIG. 1 includes blocks for calculating those set values. More specifically, the apparatus of FIG. 1 includes a physical function storage part 101 as an example of a storage part of the present invention, a process variation setting part 102 as an example of a setting part of the present invention, a SPICE parameter calculation part 103 as an example of a calculation part of the present invention, and a process variation dependency (response characteristics) output part 104 as an example of an output part of the present invention. Referring now to the flowchart of FIG. 2, the operations of those blocks are described in detail.

Figure 2:
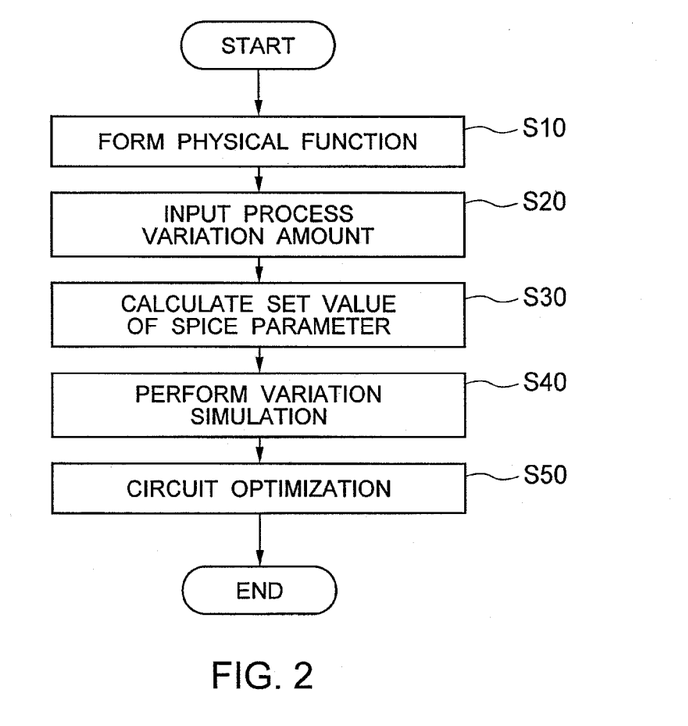
FIG. 2 is a flowchart showing a flow of a SPICE circuit simulation to be performed by using the circuit simulation apparatus of FIG. 1.

FIG. 2 is a flowchart showing a flow of a SPICE circuit simulation to be performed by using the circuit simulation apparatus of FIG. 1.

In this embodiment, the set value of a SPICE parameter is calculated by using an intermediate model expression that associates the set value of the SPICE parameter with the nominal value of the SPICE parameter. In this embodiment, the intermediate model expression (physical function) for each of the SPICE parameters is formed in advance, and is stored into the physical function storage part 101 (step S10). In this embodiment, the nominal value of a SPICE parameter is associated with the set value of the SPICE parameter according to the intermediate model expression, as expressed in the following expression (1):

$$X = X\_Param \cdot K\_X \quad (1).$$

In the expression (1), X_Param and X represent the nominal value and the set value of the SPICE parameter, respectively, and K_X represents the intermediate model expression that associates the set value of the SPICE parameter with the nominal value of the SPICE parameter. In this embodiment, the set value of the SPICE parameter is represented by the product of the nominal value of the SPICE parameter and the intermediate model expression. Examples of SPICE parameters include a threshold voltage $V_{TH0}$ of the MOSFETs and a carrier mobility $u_0$ in the MOSFETs.

The intermediate model expression is a function that includes variables related to the manufacture conditions or device structures of the MOSFETs as variables of process parameters that affect the variation characteristics of the MOSFETs. Examples of the variables related to the manufacture conditions of MOSFETs include a channel concentration ($N_{DEP}$) of the MOSFETs and a resistivity ($R_{GSH}$) of a gate electrode material of the MOSFETs. Examples of variables related to the device structures of the MOSFETs include a gate length (L) and a gate width (W) which are dimensions of a gate of the MOSFETs, and a thickness ($T_{OX}$) of a gate insulator of the MOSFETs.

Examples of the variables related to the manufacture conditions of the MOSFETs further include the resistivity of a substrate of the MOSFETs and the impurity density in source and drain diffusion layers of the MOSFETs. Examples of the variables related to the device structures of the MOSFETs further include the thickness of an interconnect layer electrically connected to the MOSFETs and the thickness of an inter layer dielectric covering the MOSFETs.

The intermediate model expression is a universal function in which the SPICE parameters are physically correlated to the variables. The universal function can express the characteristics of the MOSFETs, regardless of the generation and the process of the MOSFETs (CMOS) or the version and the type of the model to be used. As will be described later, the intermediate model expression is formed with a theoretical expression or an empirical expression that is theoretically or empirically derived. The intermediate model expression will be also referred to as a DFM function.

In this embodiment, information about each of the variables included in the intermediate model expression is input and set in the process variation setting part 102 (step S20). For example, the information may be the nominal value and the standard deviation (process variation amount) of each of the variables included in the intermediate model expression. The information may be input to the circuit simulation apparatus by a user, for example.

By using the information that is set in the process variation setting part 102 and the intermediate model expression stored in the physical function storage part 101, the SPICE parameter calculation part 103 performs a sweep of the intermediate model expression to calculate the set value of the SPICE parameter (step S30). In this procedure, the nominal value of the SPICE parameter extracted by the circuit simulation apparatus is also used.

By using the set value of the SPICE parameter calculated by the SPICE parameter calculation part 103, a variation simulation is performed through SPICE (step S40). This procedure may be carried out according to a SPICE program installed in the circuit simulation apparatus, or may be carried out according to a SPICE program installed in another apparatus. In the former case, an output such as the set value of the SPICE parameter indicating the process variation dependency (the response characteristics) of the semiconductor circuits is outputted from the process variation dependency output part 104 to a memory or storage inside the circuit simulation apparatus, for example. In the latter case, the output is outputted from the process variation dependency output part 104 to the outside of the circuit simulation apparatus.

A variation simulation is performed in the above-described manner, and an optimizing examination based on the results of the variation simulation is conducted on the circuits (step S50). In this embodiment, Monte Carlo simulation is performed. Through this simulation, results of a variation analysis on the semiconductor circuits are obtained, and the circuits are optimized by using this simulation results. The Monte Carlo simulation is performed by using a simulator or simulation software, for example. The Monte Carlo simulation will be described later in detail.

The advantages of this embodiment are now described.

As described above, the set value of the SPICE parameter is calculated by using the intermediate model expression in this embodiment. The intermediate model expression includes the variables related to the manufacture conditions or device structure of the MOSFETs as the variables affecting the variation characteristics of the MOSFETs, and the SPICE parameter is physically correlated with the variables. More specifically, the SPICE parameter representing the electric characteristics of the MOSFETs is physically correlated to amounts (physical amounts) such as process variables or structure variables that physically vary.

Accordingly, in this embodiment, the variation simulation is performed by using the calculated set values of the SPICE parameters, so that the influence of the process variations which represent the variations of the manufacture conditions and device structure of the MOSFETs on the variations in the characteristics of the semiconductor circuits can be observed. Accordingly, the influence can be directly predicted and be physically analyzed in a significant manner. Furthermore, in this embodiment, not only the influence on the logic DC characteristics of the semiconductor circuits, but also the influence on the analog RF characteristics and the noise characteristics can be simulated with high precision.

Further, in this embodiment, a physical correlation such as the process correlation is reflected in each of the variables included in intermediate model expressions through the universal function including the variables which are physically correlated to the SPICE parameters. Accordingly, the intermediate model expressions can be readily used for other processes, not depending on the MOSFET compact model. In accordance with this embodiment, a model is more easily constructed than a model constructed by a method of representing the variations of specific parameters based on measured data and specifications of samples or a method of making pseudo predictions by a device simulation technique, or a PCM (Principle Component Monitor) model showing polynomial equations expressing the substantial intermediate variables derived by carrying out a main component analysis on a large amount of data, though the PCM model method is becoming a main stream these days. In this embodiment, the number of development procedures can be dramatically reduced.

Figure 3:
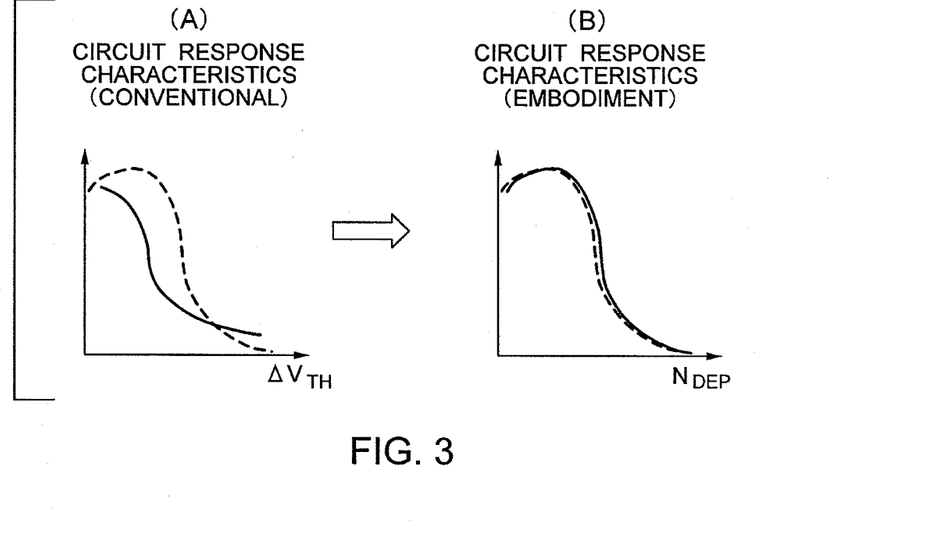
FIG. 3 shows graphs schematically showing variations of circuit characteristics.

FIG. 3 shows graphs schematically showing variations of circuit characteristics.

FIG. 3(A) is a graph showing an example of circuit response characteristics obtained through a conventional SPICE circuit simulation. The solid line indicates the simulation result, and the dotted line indicates the corresponding actual measurement result. By the conventional technique, the circuit characteristics varying with the variation of the SPICE parameter can be observed, as shown in FIG. 3(A). In FIG. 3(A), the threshold voltage $V_{TH}$ is shown as an example of the SPICE parameter. However, the circuit characteristics varying with the process variation cannot be directly expressed by the conventional technique. Therefore, there is a limit to the fitting accuracy.

FIG. 3(B) is a graph showing an example of the circuit response characteristics obtained through the SPICE circuit simulation according to this embodiment. As in FIG. 3(A), the solid line indicates the simulation result, and the dotted line indicates the corresponding actual measurement result. In this embodiment, the circuit characteristics varying with the process parameter affecting the variation characteristics of the MOSFETs can be observed, as shown in FIG. 3(B). In FIG. 3(B), a channel concentration $N_{DEP}$ is shown as an example of the process parameter. In this manner, the circuit characteristics varying with the process variation can be directly observed, and a physically meaningful analysis is realized in this embodiment. Accordingly, the fitting accuracy becomes higher (see the solid lines and dotted lines in FIGS. 3(A) and 3(B)).

By the conventional technique, the low-frequency characteristics of the circuit characteristics varying with the threshold voltage $V_{TH}$ and a drain current Idr can be observed. In addition to that, the radio-frequency characteristics of the circuit characteristics varying with ΔRout, noise, and fT can be observed in this embodiment.

The following is a description of examples of intermediate model expressions in this embodiment.

An example of the intermediate model expression used where the SPICE parameter is the threshold voltage $V_{TH}$ is represented by the following expressions (2) and (3):

$$V_{TH} = V_{TH\_}\text{Param} \cdot K\_V_{TH}, \qquad (2)$$

$$K\_V_{TH} = \frac{\sqrt{2\sqrt{2}} \cdot \frac{T_{OX}}{\varepsilon} \cdot (q^3 \cdot \varepsilon_{si} \cdot \phi_s \cdot N_{DEP})^{1/4} / \sqrt{W \cdot L}}{\sqrt{2\sqrt{2}} \cdot \frac{T_{OX0}}{\varepsilon} \cdot (q^3 \cdot \varepsilon_{si} \cdot \phi_s \cdot N_{DEP0})^{1/4} / \sqrt{W_o \cdot L_o}} \qquad (3)$$

$$= \frac{T_{OX}}{T_{OX0}} \cdot \left(\frac{N_{DEP}}{N_{DEP0}}\right)^{\frac{1}{4}} \cdot \sqrt{\frac{W_o \cdot L_o}{W \cdot L}}.$$

The expression (2) is a relational expression that links the threshold voltage with the intermediate model expression. The expression (3) is a theoretical expression of the intermediate model expression for the threshold voltage. Here, $V_{TH\_}$Param and $V_{TH}$ represent the nominal value and the set value of the threshold voltage, respectively, and $K\_V_{TH}$ represents the intermediate model expression that associates the nominal value of the threshold voltage with the set value of the threshold voltage. Further, $\phi_S$ represents the surface potential that is supplied from outside.

As shown in the expression (3), the intermediate model expression $K\_V_{TH}$ is a function that includes the channel concentration $N_{DEP}$ (the nominal value being $N_{DEP0}$), the gate length L, the gate width W, and the thickness $T_{OX}$ of the gate insulator (the nominal value being $T_{OX0}$). By using the expressions (2) and (3), the set value of the threshold voltage for analyzing the variations in the analog low-frequency characteristics of the semiconductor circuits can be calculated in this embodiment.

Examples of the intermediate model expressions used where the SPICE parameter is the carrier mobility $u_o$ are represented by the following expressions (4) to (6):

$$\mu o = \mu o\_\text{Param} \cdot (\mu e \text{ or } \mu h) \qquad (4),$$

$$\mu e = 7022.7 - 160 \cdot \log(N_{DEP}/1.3) \qquad (5),$$

$$\mu h = 1908.8 - 41.81 \cdot \log(N_{DEP}) \qquad (6).$$

The expression (4) is a relational expression that links the carrier mobility with each intermediate model expression. The expression (5) represents an empirical expression of the intermediate model expression for the electron mobility. The expression (6) represents an empirical expression of the intermediate model expression for the hole mobility. Here, $u_o\_$Param and $u_o$ represent the nominal value and the set value of the carrier mobility, and $u_e$ and $u_h$ represent the intermediate model expressions that associate the nominal values of the electron mobility and the hole mobility with the set values of the electron mobility and the hole mobility, respectively.

Figure 4:
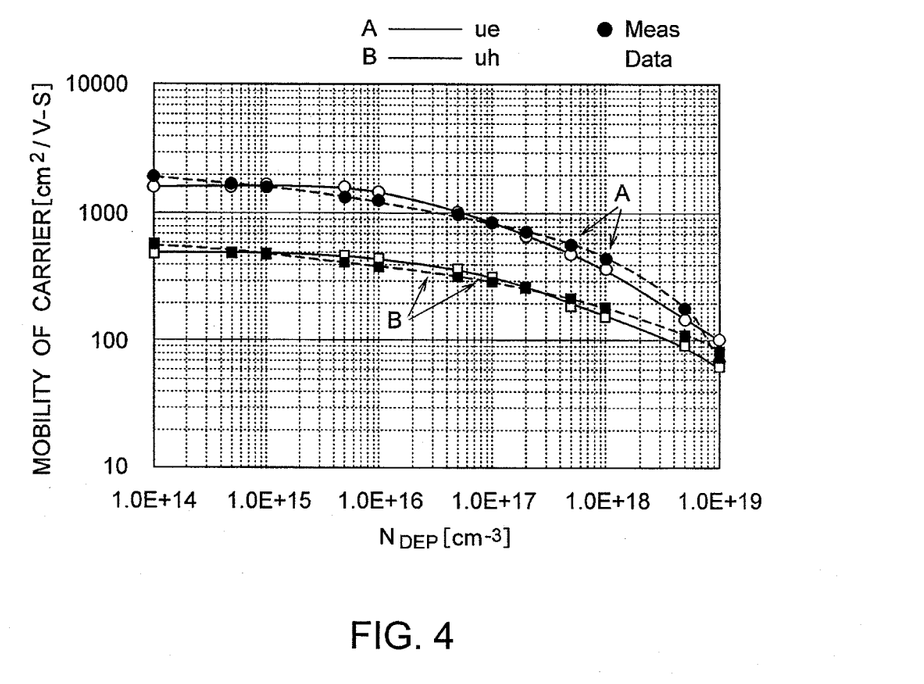
FIG. 4 is a graph showing measured data of carrier mobilities and results of deriving expressions (4) and (5)

The expressions (5) and (6) are empirical expressions that are set to match measured data of carrier mobilities. FIG. 4 is a graph showing the measured data of the carrier mobilities and results of deriving the expressions (5) and (6). In FIG. 4, the dashed line and solid line denoted by A represent the measured data and the empirical expression of the electron mobility, respectively. The dashed line and solid line denoted by B represent the measured data and the empirical expression of the hole mobility, respectively. According to the measured data shown in FIG. 4, the intermediate model expressions for the electron mobility and the hole mobility are expressed as the functions of the channel impurity concentration $N_{DEP}$, as shown in the expressions (5) and (6).

Figure 5:
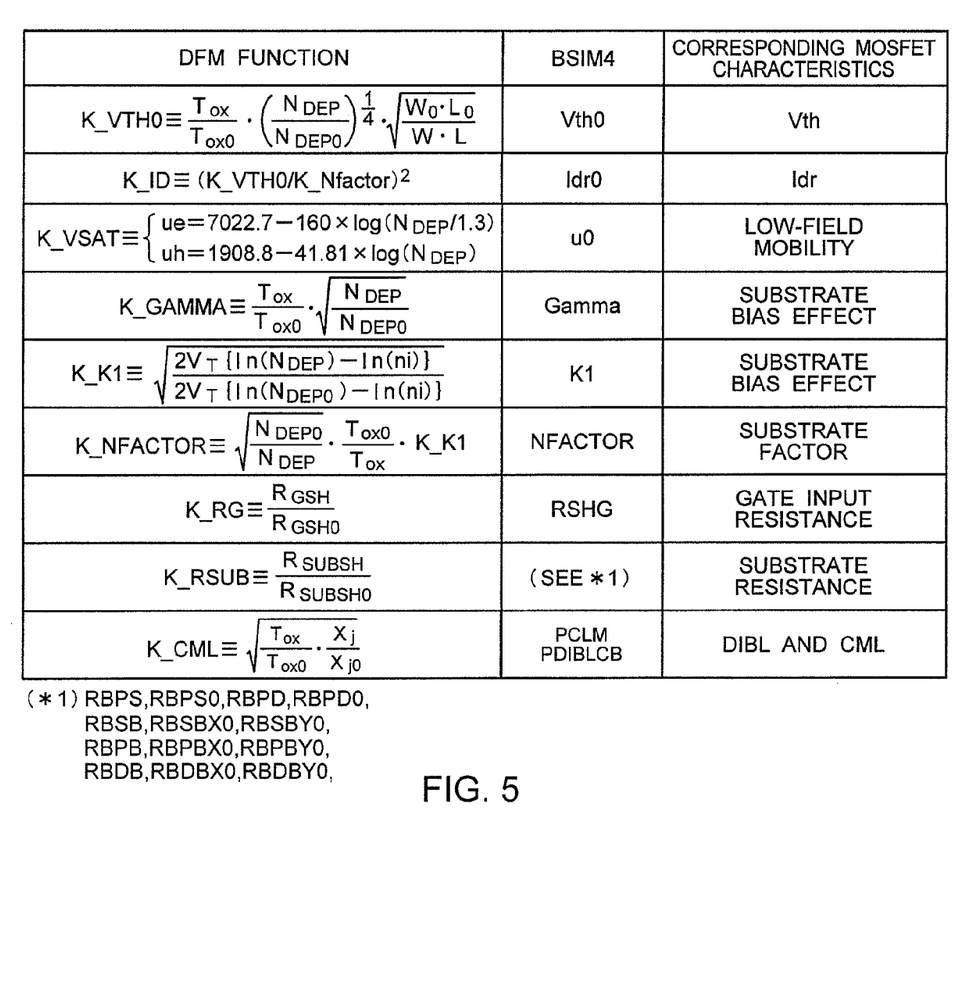
FIGS. 5 and 6 are tables listing examples of intermediate model expressions.
Figure 6:
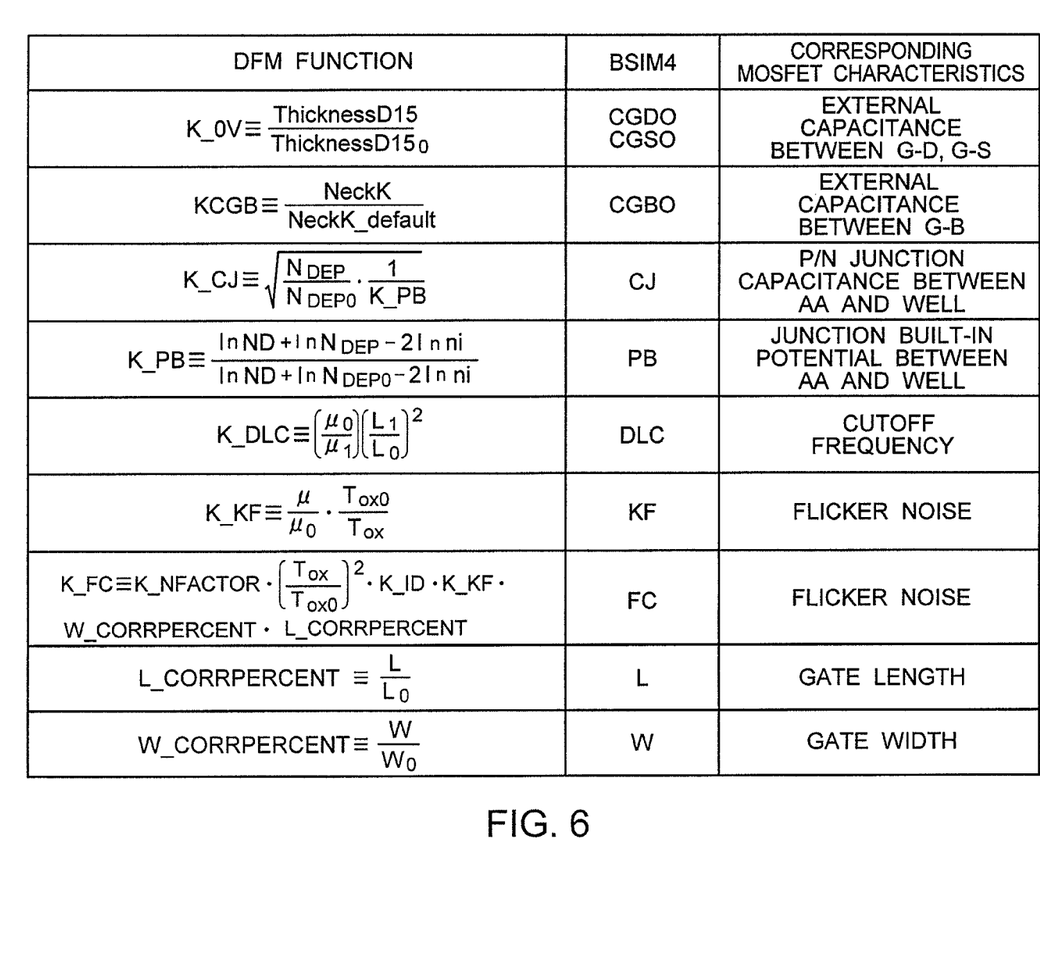

Other examples of intermediate model expressions are listed in FIGS. 5 and 6. FIGS. 5 and 6 are tables listing the examples of the intermediate model expressions. FIGS. 5 and 6 show the relationships among the intermediate model expressions (DFM functions), the SPICE parameters in BSIM models, and the corresponding MOSFET characteristics. By using those intermediate model expressions, the set values of the SPICE parameters for analyzing the variations in the analog low-frequency characteristics, the analog radio-frequency characteristics, and the noise characteristics of semiconductor circuits can be calculated in this embodiment. Here, ni represents the intrinsic carrier density in the well regions.

In FIGS. 5 and 6, $R_{GSH}$ represents the resistivity of the gate electrode material in the MOSFETs, $R_{SUBSH}$ represents the resistivity of the substrate, $N_{DNS}$ represents the impurity density in the source/drain diffusion layers. Further, ThicknessD15 represents the total sum of the thickness of the interconnect layer electrically connected to the MOSFETs and the thickness of the inter layer dielectric covering the MOSFETs (ThicknessD15$_0$ representing the nominal value). More specifically, $R_{GSH}$ is equivalent to the proportionality factor representing the parasitic resistance caused by the gate polysilicon electrode material, and $R_{SUBSH}$ is equivalent to the resistivity of the well regions in the MOSFETs.

As described above, by using the intermediate model expression that associates the nominal values of the SPICE parameters with the set values of the SPICE parameters, the set values of the SPICE parameters for analyzing the variations among semiconductor circuits including MOSFETs are calculated in this embodiment. The intermediate model expression includes the variables related to the manufacture conditions or the device structure of the MOSFETs as the variables affecting the variation characteristics of the MOSFETs, and the set values of the SPICE parameters are calculated by using the information such as the nominal values and the standard deviations related to the variables, and the intermediate model expression. In this manner, the influence of the process variations on the variations in the circuit characteristics of the semiconductor circuits can be directly predicted in this embodiment. In accordance with this embodiment, not only the influence on the logic DC characteristics of the semiconductor circuits, but also the influence on the analog RF characteristics and the noise characteristics can be simulated with high precision.

The operation illustrated in FIG. 2 can be realized by a computer program that causes a computer to perform a series of information processing: reading the intermediate model expression stored in the physical function storage part 101 at step S10, reading the information set in the process variation setting part 102 at step S20, and carrying out the calculating procedure of step S30 and the outputting procedure of step S40 with the use of the read intermediate model expression and the read information. Such a computer program is stored in a computer readable recording medium such as a CD-ROM, a DVD, a semiconductor memory, or a magnetic memory, and is then used.

In the following, second to fourth embodiments of the present invention are described. Those embodiments are modifications of the first embodiment, and differences from the first embodiment are mainly described in the following.

Second Embodiment

Figure 7:
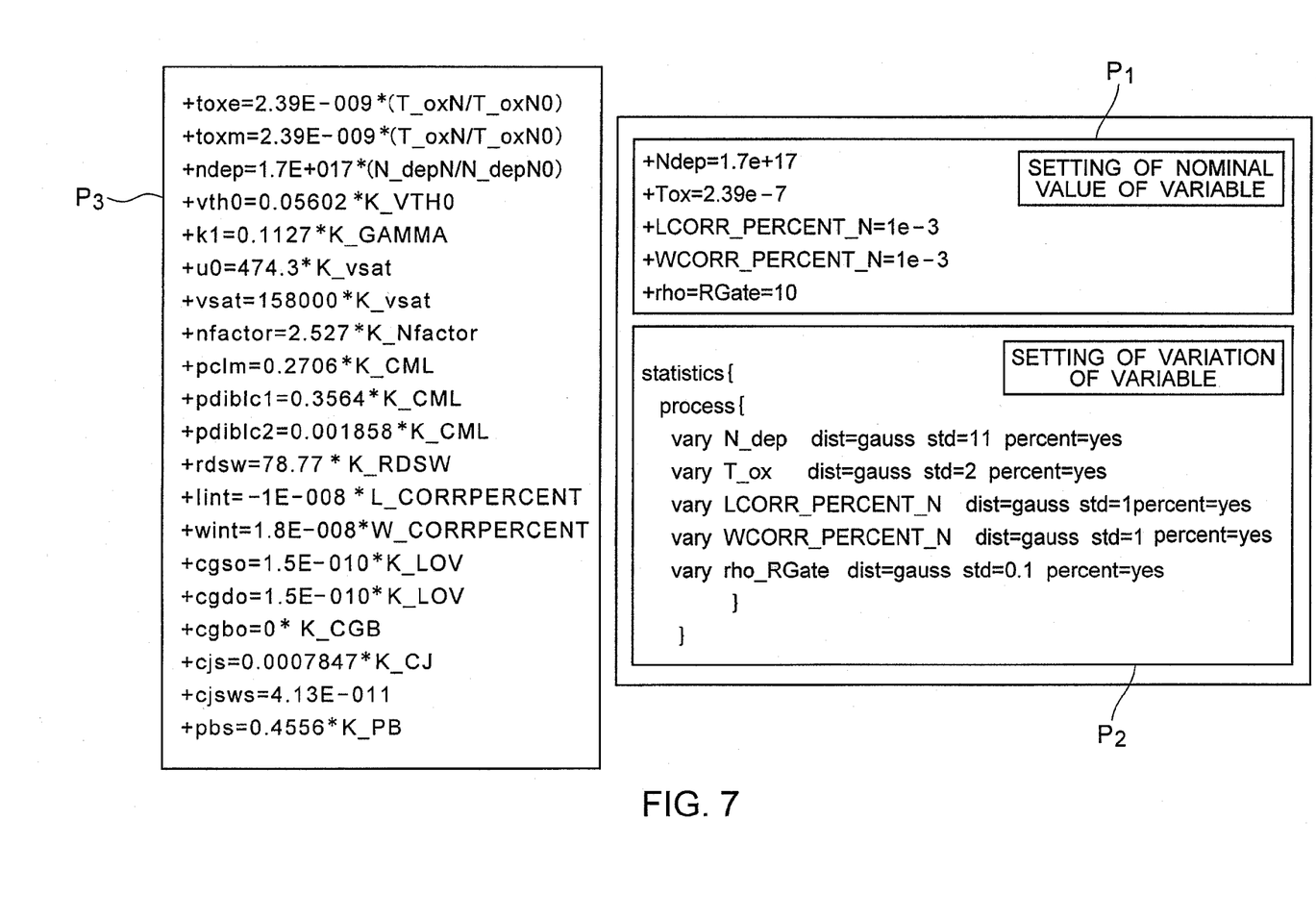
FIG. 7 is a diagram for explaining a SPICE circuit simulation according to a second embodiment.

FIG. 7 is a diagram for explaining a SPICE circuit simulation according to a second embodiment. FIG. 7 shows an example where the set values of the SPICE parameters calculated in the first embodiment are incorporated into BSIM models.

In FIG. 7, $P_1$ and $P_2$ represent the set contents of the nominal values and the standard deviations of the variables included in the intermediate model expressions. Also, $P_3$ in FIG. 7 represents the set values of those variables and the SPICE parameters.

The SPICE parameters are incorporated into the BSIM models by multiplying the extracted nominal values of the SPICE parameters by the intermediate model expressions, and setting the obtained products as the SPICE parameters. In this embodiment, the nominal values and the standard deviations of the variables included in the intermediate model expressions are set as shown in FIG. 7. In FIG. 7, $P_1$ indicates the five variables used in this embodiment.

In this embodiment, a Monte Carlo simulation is performed in the above settings. Accordingly, the intermediate model expressions vary with the variation set values of the five variables, and the results of a variation analysis carried out on the semiconductor circuits are obtained.

In this manner, the influence of the process variations on the variations in the circuit characteristics of the semiconductor circuits can be directly predicted in this embodiment.

Third Embodiment

Figure 8:
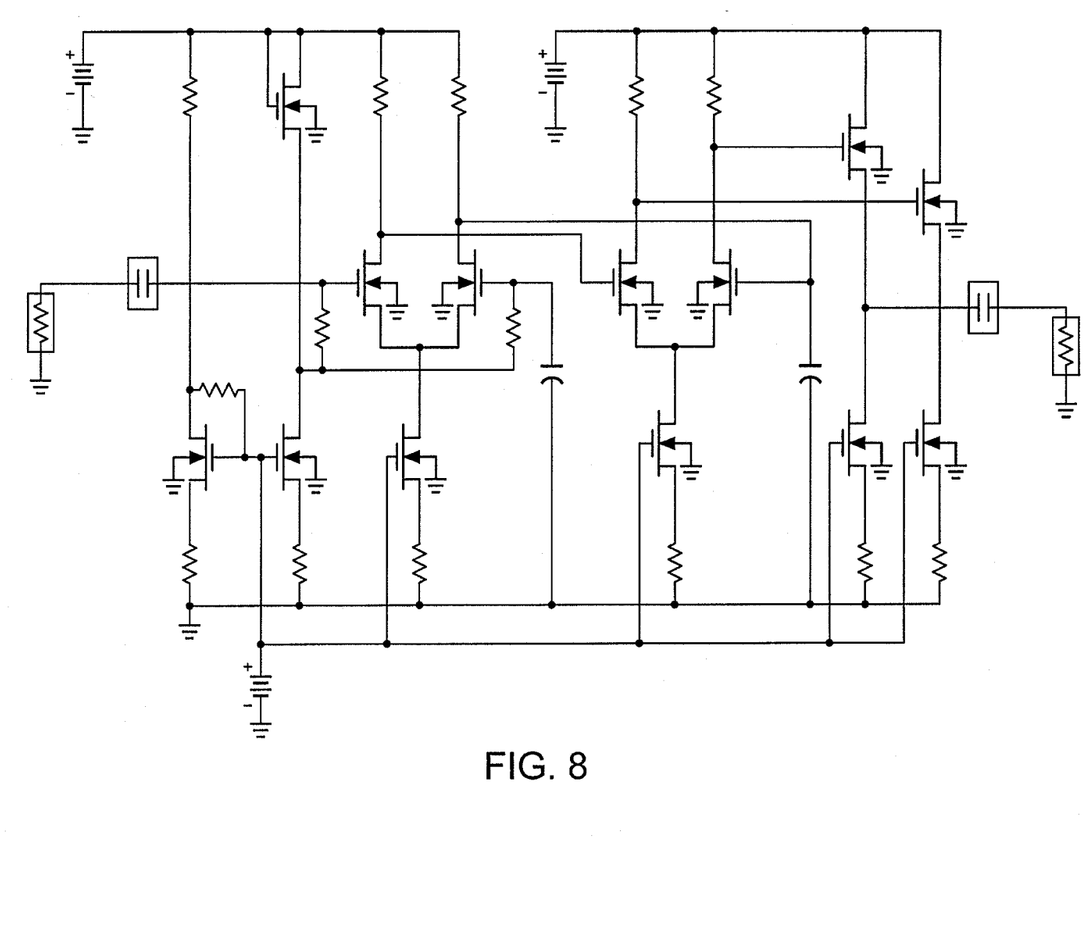
FIG. 8 is a circuit diagram for explaining a SPICE circuit simulation according to a third embodiment.

FIG. 8 is a circuit diagram for explaining a SPICE circuit simulation according to a third embodiment. FIG. 8 shows a circuit diagram of a verification circuit as an example of a semiconductor circuit on which the simulation is to be performed.

FIG. 8 shows two vertically-connected differential amplifiers (70-nm CMOS Technology). In all the MOSFETs used in the circuit shown in FIG. 8, the gate length L is 70 nm, and the gate width W is 20 μm. Each of the resistive elements is realized by connecting one or more elements having a width of 4 μm and a resistance value of 500Ω in series or parallel. In this manner, the desired resistance value is realized. The circuit illustrated in FIG. 8 further includes a MIM capacitor.

In this embodiment, the SPICE circuit simulation according to the first and second embodiments is used in the verification circuit illustrated in FIG. 8. This simulation will be described in detail in the later described embodiments. This simulation can also be used in semiconductor circuits having other structures.

Fourth Embodiment

Figure 9:
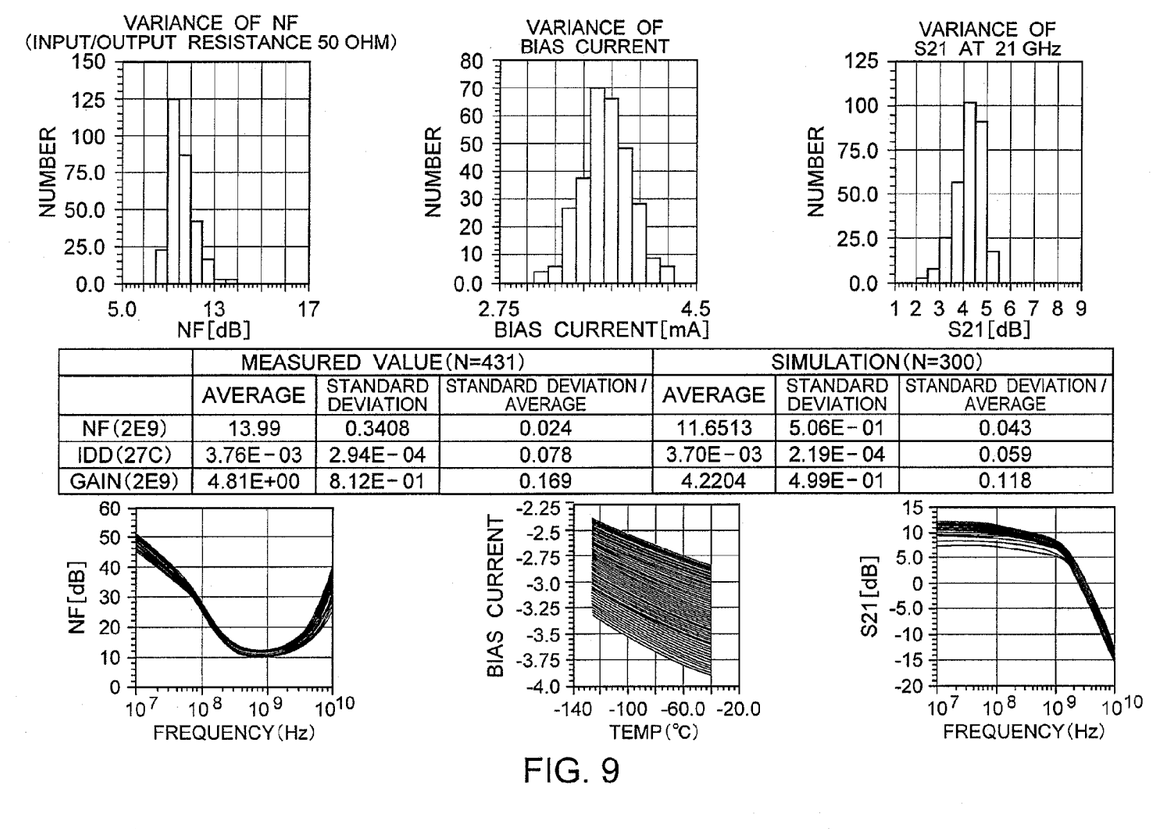
FIG. 9 shows graphs and a table for explaining a SPICE circuit simulation according to a fourth embodiment.

FIG. 9 shows graphs and a table for explaining a SPICE circuit simulation according to a fourth embodiment. FIG. 9 shows the results of a Monte Carlo simulation performed on the verification circuit illustrated in FIG. 8, and the comparisons between the results of the Monte Carlo simulation and measured data.

In this embodiment, the NF, bias current, and S21 [dB] of the circuit are used as the indices of the variation characteristics of the semiconductor circuit. FIG. 9 shows the results (simulation results) of the analysis carried out on those indices and the measured data.

As shown in FIG. 9, while the measured value of the standard deviation of the NF at 2 GHz (or the measured value obtained by dividing the standard deviation by the average value, to be more exact) is 0.024, the standard deviation obtained from the analysis result (the value obtained by dividing the standard deviation by the average value, to be more exact) is 0.043. While the measured value of the standard deviation of the bias current is 0.078, the standard deviation obtained from the analysis results is 0.059. Also, while the measured value of the standard deviation of S21 at 2 GHz is 0.169, the standard deviation obtained from the analysis results is 0.118.

As described above, through the above-described circuit simulation, it is possible to obtain significant results for variation analyses.

Fifth Embodiment

In a fifth embodiment, a method of deriving the intermediate model expressions (DFM functions) shown in FIGS. 5 and 6 is described in detail.

The drain current Idr shown in FIG. 5 can be derived from the expression of the drain current in a strong inversion region. The intermediate model expression K_ID of the drain current Idr is derived according to the following expression (7):

$$K\_ID = \frac{ID\_SI(n, \mu, C_{OX})}{ID\_SI(n_0, \mu_0, C_{OX0})} \quad (7)$$

$$= \left\{ \frac{\ln(1 + e^{V_{EF}})}{\ln(1 + e^{V_{EF0}})} \right\}^2$$

where $$V_{EF} = \frac{V_{GS} - V_{TH}}{2nU_T}$$

$$V_{EF0} = \frac{V_{GS} - V_{TH0}}{2n_0 U_T}$$

$$\text{in\_strong\_invertion} \approx \left\{ \frac{\ln(e^{V_{EF}})}{\ln(e^{V_{EF0}})} \right\}^2 = \left[ \frac{V_{EF}}{V_{EF0}} \right]^2$$

$$= \left[ \frac{n_0}{n} \cdot \frac{V_{GH} - V_{TH}}{V_{GH} - V_{TH0}} \right]^2 \approx \left( \frac{K\_VTH}{K\_Nfactor} \right)^2.$$

The intermediate model expression K_L0V of the external capacitance between the gate and the drain (G-D), and the external capacitance between the gate and the source (G-S) is derived according to the expression (8). The set values of those capacitances are derived according to the expressions (9) and (10), respectively.

$$K\_L0V = \frac{ThicknessD15}{ThicknessD15_0}, \quad (8)$$

$$CGDO = K\_L0V \times CGDO\_param, \quad (9)$$

$$CGSO = K\_L0V \times CGSO\_param. \quad (10)$$

Figure 10:
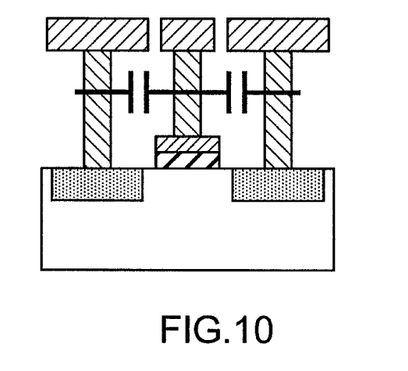
FIG. 10 is a sectional side view for explaining a method of deriving intermediate model expressions of external capacitances between a gate and a drain (G-D) and between the gate and a source (G-S)

Those expressions are calculated on the assumption that the interconnect width variation contributes to the interelectrode coupling capacitance as shown in FIG. 10. FIG. 10 is a sectional side view for explaining a method of deriving the intermediate model expressions of the external capacitances between G-D and between G-S.

The intermediate model expression KCGB of the external capacitance between the gate and the backgate (G-B) is derived according to the expression (11), and the set value of this capacitance is derived according to the expression (12).

$$KCGB \equiv \frac{NeckK}{NeckK\_default}, \quad (11)$$

$$CGBO = KCGB \times CGBO\_param. \quad (12)$$

Figure 11:
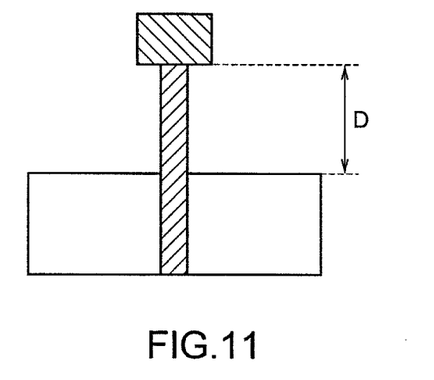
FIG. 11 is a sectional side view for explaining a method of deriving an intermediate model expression of an external capacitance between the gate and a backgate (G-B)

Those expressions are calculated on the assumption that a neck length D contributes to the coupling capacitance as shown in FIG. 11. FIG. 11 is a sectional side view for explaining a method of deriving the intermediate model expression of the external capacitance between G-B.

Figure 12:
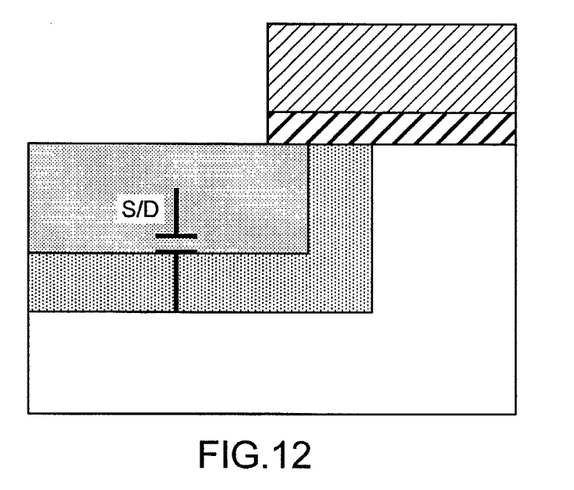
FIG. 12 is a sectional side view showing a P/N junction capacitance between an AA (Active Area) and a well.

As for the P/N junction capacitance and P/N junction built-in potential between an AA (Active Area) and a well (see FIG. 12), set values CJ and PB are derived according to the expressions (13) and (14), respectively, and the relational expression between CJ and PB is represented by the expression (15). FIG. 12 is a sectional side view showing the P/N junction capacitance between the AA and the well.

$$CJ = CJ\_Param \times K\_CJ, \quad (13)$$

$$PB = PB\_Param \times K\_PB, \quad (14)$$

$$CJ(\text{or } CJSW) = \frac{1}{\left(1 + \frac{VDB}{PB(\text{or } PBSW)}\right)^{MJ(\text{or } MJSW)}}. \quad (15)$$

An intermediate model expression K_CJ of CJ is derived according to the expression (16), and an intermediate model expression K_PB of PB is derived according to the expression (18) with the use of the expression (17).

$$K\_CJ = A \cdot \sqrt{\frac{N_{DEP}}{N_{DEP0}} \cdot \frac{1}{K\_PB}}, \quad (16)$$

$$PB = \frac{kt}{q} \ln \frac{N_{DEP} \cdot NDS}{Ni^2}, \quad (17)$$

$$K\_PB = \frac{\ln \frac{ND \cdot N_{DEP}}{Ni^2}}{\ln \frac{ND \cdot N_{DEP0}}{Ni^2}} = \frac{\ln ND + \ln N_{DEP} - 2\ln ni}{\ln ND + \ln N_{DEP0} - 2\ln ni}. \quad (18)$$

A set value DLC of the cutoff frequency is derived according to the expression (19), and an intermediate model expression K_DLC of DLC is derived according to the expression (23) with the use of the expressions (20) to (22).

$$DLC = DLC\_Param \times K\_DLC, \quad (19)$$

-continued $$F_{Ti} \cong \frac{gm}{2\pi(Cgsi+Cgbi)} \quad (20)$$

$$= \frac{gm}{2\pi(Cgsi+Cgbi) \times CGOX}$$

$$= \frac{gm}{2\pi(Cgsi+Cgbi) \times W \cdot L \cdot C_{OX}}$$

$$= \frac{I_C}{\sqrt{I_C + \frac{1}{4}} + 0.5} \cdot \frac{\mu_0 \cdot V_T}{\pi(Cgsi+Cgb)L^2},$$

$$F_T \text{ at weak inversion} = \frac{I_C \cdot \mu_0 \cdot V_T}{\pi L^2} \cdot \left(\frac{n}{n-1}\right), \quad (21)$$

$$F_T \text{ at strong inversion} = \frac{\sqrt{I_C \cdot \mu_0 \cdot V_T}}{\pi L^2} \cdot \left(\frac{n}{n-\frac{1}{3}}\right), \quad (22)$$

$$K\_DLC = \frac{\frac{I_{C0} \cdot \mu_0 \cdot V_T}{L_0^2} \cdot \frac{n_0}{n_0 - 1}}{\frac{I_{C1} \cdot \mu_1 \cdot V_T}{L_1^2} \cdot \frac{n_1}{n_1 - 1}} \quad (23)$$

$$= \frac{(\mu_0/L_0^2)(n_0/n_0 - 1)}{(\mu_1/L_1^2)(n_1/n_1 - 1)}$$

$$\approx \left(\frac{\mu_0}{\mu_1}\right)\left(\frac{L_1}{L_0}\right)^2.$$

As for the thermal noise, the set values of a gate parasitic resistance RG and a substrate resistance RSUB are derived according to the following expressions (24) and (25).

$$RG = RG\_Param \times K\_RG \quad (24),$$

$$RSUB(1/2/3/4) = RSUB(1/2/3/4)\_Param \times K\_RSUB \quad (25).$$

Figure 13:
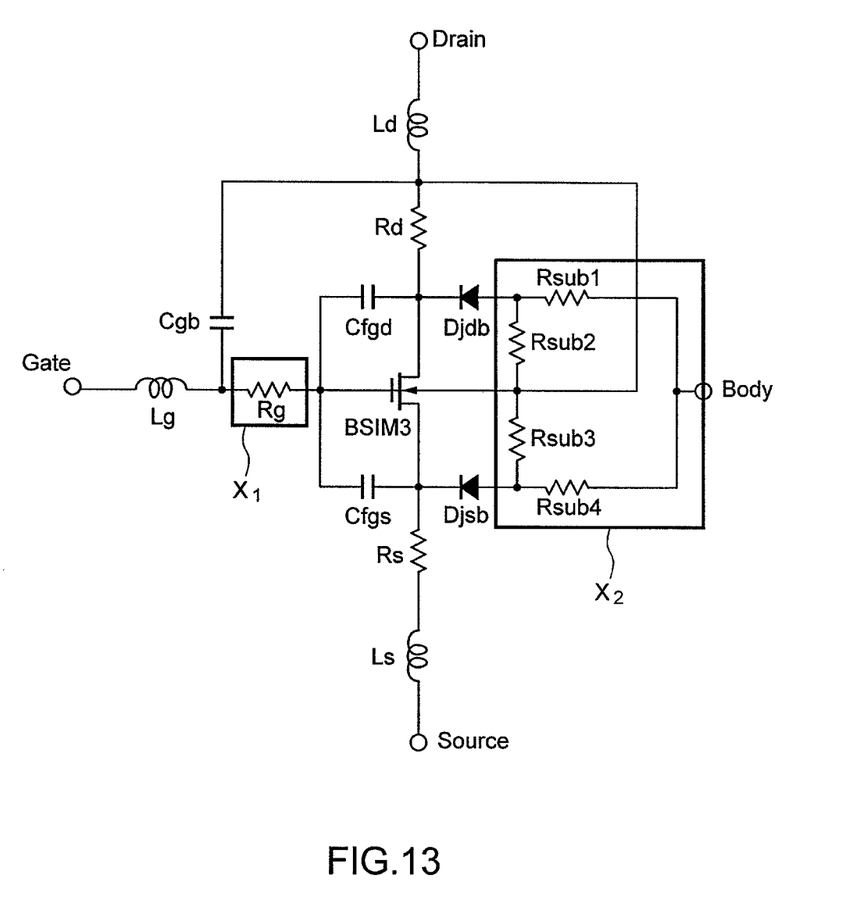
FIG. 13 is a circuit diagram showing an example of a circuit for explaining thermal noise.

In the exemplary circuit illustrated in FIG. 13, the portions denoted by $X_1$ and $X_2$ are equivalent to the parasitic elements that generate noise, and are related to the thermal noise. FIG. 13 is a circuit diagram showing an example of a circuit for explaining the thermal noise.

As for the flicker noise, a set value KF is represented by the expression (26), and an intermediate model expression K_KF is derived according to the expression (30) using the expressions (27) to (29).

$$KF = KF\_Param \times K\_KF, \quad (26)$$

$$S_{VG}(f) \cong \frac{I_C}{L^2} \frac{I_0}{I_D} \frac{k'_{F0}}{f^{AF}} \left(1 + \frac{2nV_T\sqrt{I_C}}{VKF}\right)^2, \quad (27)$$

$$VKF = \frac{2q}{\alpha_{SC} \cdot \mu \cdot C_{OX}}, \quad (28)$$

$$K_F = K_{F0}\left(1 + \frac{V_{GS} - V_T}{V_{KF}}\right)^2 \cong K_{F0}\left(1 + \frac{2nV_T\sqrt{I_C}}{V_{KF}}\right)^2, \quad (29)$$

$$K\_KF \equiv \left(\frac{\frac{1}{V_{KF}}}{\frac{1}{V_{KF0}}}\right) = \frac{V_{KF0}}{V_{KF}} = \frac{\mu \cdot C_{OX}}{\mu_0 \cdot C_{OX0}} = \frac{\mu}{\mu_0} \cdot \frac{T_{OX0}}{T_{OX}}. \quad (30)$$

Likewise, a set value FC related to the flicker noise is represented by the expression (31), and an intermediate model expression K_FC is derived according to the expression (35) using the expressions (32) to (34).

$$FC = FC\_Param \times K\_FC, \quad (31)$$

$$S_{VG}\_\text{thermal}(f_C) = S_{VG}\_\text{flicker}(f_C), \quad (32)$$

$$\frac{4kT \cdot n\Gamma}{gm} = \frac{KF}{C_{OX}^2 WLf_C^{AF}}, \quad (33)$$

$$f_C^{AF} = \frac{KF}{n\Gamma} \cdot \frac{gm}{C_{OX}^2 W \cdot L}, \quad (34)$$

$$K\_FC \equiv \frac{n_0}{n} \frac{\Gamma_0}{\Gamma} \left(\frac{C_{OX0}}{C_{OX}}\right)^2 \frac{g_{m0}}{g_m} \frac{KF}{KF_0} \cdot \frac{W_0 L_0}{WL} \quad (35)$$

$$= K\_\text{NFACTOR} \cdot \left(\frac{T_{OX}}{T_{OX0}}\right)^2 \cdot K\_ID \cdot K\_KF \times$$

$$W\_\text{CORRPERCENT} \cdot L\_\text{CORRPERCENT}.$$

In this embodiment, by using those intermediate model expressions, a simulation is performed so that the influence of the process variations can be directly observed.

As described above, according to the embodiments of the present invention, the number of development procedures for the SPICE model necessary for the variation analysis can be reduced, regardless of the process generation and the compact model of each MOSFET. High precision required not only for the logic circuit characteristics but also for the analog radio-frequency characteristics and the noise characteristics can be achieved. The influence of the process variations on the variations in the circuit characteristics of semiconductor circuits can be directly predicted. Each of the embodiments can provide a circuit simulation apparatus and method and a recording medium that can achieve the above effects.

Although the first to fourth embodiments have been described by way of specific examples of the present invention, the present invention is not limited to those embodiments.

The invention claimed is:

1. A circuit simulation apparatus configured to calculate a set value of a SPICE parameter of a MOSFET suitable for use in carrying out a variation analysis on a semiconductor circuit comprising the MOSFET, the apparatus comprising:
    a storage device configured to store an intermediate model expression comprising a variable related to a manufacture condition or device structure of the MOSFET as a variable affecting variation characteristics of the MOSFET, the intermediate model expression further comprising a universal function having a physical correlation between a physical amount defined by the variable and the SPICE parameter;
    a setting part configured to set information about the variable included in the intermediate model expression;
    a calculation part configured to calculate the set value of the SPICE parameter by using the information set in the setting part and the intermediate model expression stored in the storage device; and
    an output part configured to output process variation dependency of the semiconductor circuit.

2. The apparatus of claim 1, wherein
    the intermediate model expression comprises a variable comprising at least one of a channel concentration, a dimension of a gate, and a thickness of a gate insulator of the MOSFET, and
    the calculation part is further configured to calculate a set value suitable for use in analyzing a variation in analog low-frequency characteristics of the semiconductor circuit.

3. The apparatus of claim 2, wherein the intermediate model expression comprises a representation of the expression (36):

$$K\_V_{TH} = \frac{T_{OX}}{T_{OX0}} \cdot \left(\frac{N_{DEP}}{N_{DEP0}}\right)^{\frac{1}{4}} \cdot \sqrt{\frac{W_o \cdot L_o}{W \cdot L}}, \quad (36)$$

where $K\_V_{TH}$ represents the intermediate model expression, L and W respectively represent a gate length and a gate width, each of which is the dimension of the gate, $T_{OX}$ represents the thickness of the gate insulator, $N_{DEP}$ represents the channel concentration, and $L_0$, $W_0$, $T_{OX0}$, and $N_{DEP0}$ respectively represents nominal values of L, W, $T_{OX}$, and $N_{DEP}$, in a case where the SPICE parameter is a threshold voltage of the MOSFET.

4. The apparatus of claim 1, wherein
the intermediate model expression comprises a variable comprising at least one of a resistivity of a gate electrode material, a resistivity of a substrate, and an impurity density in source and drain diffusion layers of the MOSFET, a thickness of an interconnect layer electrically connected to the MOSFET, and a thickness of an inter layer dielectric covering the MOSFET, and
the calculation part is further configured to calculate a set value suitable for use in analyzing a variation in analog radio-frequency characteristics or noise characteristics of the semiconductor circuit.

5. The apparatus of claim 1, wherein the intermediate model expression comprises a representation of the expression (37):

$$\mu e = 7022.7 - 160 \cdot \log(N_{DEP}/1.3) \quad (37),$$

where μe represents the intermediate model expression, and $N_{DEP}$ represents a channel concentration of the MOSFET, in a case where the SPICE parameter is an electron mobility in the MOSFET.

6. The apparatus of claim 1, wherein the intermediate model expression comprises a representation of the expression (38):

$$\mu h = 190.8 - 418.81 \cdot \log(N_{DEP}) \quad (38),$$

where μh represents the intermediate model expression, and $N_{DEP}$ represents a channel concentration of the MOSFET, in a case where the SPICE parameter is a hole mobility in the MOSFET.

7. The apparatus of claim 1, wherein
the intermediate model expression comprises an association between the set value of the SPICE parameter and a nominal value of the SPICE parameter.

8. The apparatus of claim 7, wherein
the calculation part is further configured to represent the set value of the SPICE parameter by a product of the nominal value of the SPICE parameter and the intermediate model expression.

9. The apparatus of claim 7, wherein
the intermediate model expression is formed and stored in the storage device before the information about the variable included in the intermediate model expression is set in the setting part.

10. The apparatus of claim 1, wherein
the information set in the setting part comprises a nominal value and a standard deviation of the variable in the intermediate model expression.

11. The apparatus of claim 1, wherein
the calculation part is configured to calculate the set value of the SPICE parameter by using a nominal value of the SPICE parameter.

12. A circuit simulation method of calculating a set value of a SPICE parameter of a MOSFET suitable for use in carrying out a variation analysis on a semiconductor circuit comprising the MOSFET, the method being performed by information processing apparatus and comprising:
storing, in the information processing apparatus, an intermediate model expression that comprising a variable related to a manufacture condition or device structure of the MOSFET as a variable affecting variation characteristics of the MOSFET, the intermediate model expression being further comprising a universal function having a physical correlation between a physical amount defined by the variable and the SPICE parameter;
setting, in the information processing apparatus, information about the variable included in the intermediate model expression;
calculating the set value of the SPICE parameter by using the information and the intermediate model expression; and
outputting process variation dependency of the semiconductor circuit.

13. The method of claim 12, wherein
the intermediate model expression comprises a variable comprising at least one of a channel concentration, a dimension of a gate, and a thickness of a gate insulator of the MOSFET, and
calculating comprises calculating a set value suitable for use in analyzing a variation in analog low-frequency characteristics of the semiconductor circuit.

14. The method of claim 12, wherein
the intermediate model expression comprises a variable comprising at least one of a resistivity of a gate electrode material, a resistivity of a substrate, and an impurity density in source and drain diffusion layers of the MOSFET, a thickness of an interconnect layer electrically connected to the MOSFET, and a thickness of an inter layer dielectric covering the MOSFET, and
calculating comprises calculating a set value suitable for use in analyzing a variation in analog radio-frequency characteristics or noise characteristics of the semiconductor circuit.

15. The method of claim 12, wherein
the intermediate model expression comprises an association between the set value of the SPICE parameter and a nominal value of the SPICE parameter.

16. The method of claim 15, wherein
the set value of the SPICE parameter comprises a representation of a product of the nominal value of the SPICE parameter and the intermediate model expression.

17. The method of claim 12, wherein
the intermediate model expression is formed and stored in the information processing apparatus before the information about the variable included in the intermediate model expression is set in the setting part.

18. The method of claim 12, wherein
the information comprises a nominal value and a standard deviation of the variable included in the intermediate model expression.

19. The method of claim 12, wherein calculating the set value of the SPICE parameter comprises using a nominal value of the SPICE parameter.

20. A computer readable non-transitory storage medium comprising computer executable instructions that, when executed on a computer, implement a circuit simulation method of calculating a set value of a SPICE parameter of a MOSFET suitable for use in carrying out a variation analysis on a semiconductor circuit comprising the MOSFET, the method comprising:
  reading, from a storage device, an intermediate model expression that comprising a variable related to a manufacture condition or device structure of the MOSFET as a variable affecting variation characteristics of the MOSFET, the intermediate model expression comprising a universal function having a physical correlation between a physical amount defined by the variable and the SPICE parameter;
  reading, from a setting part, information about the variable in the intermediate model expression;
  calculating the set value of the SPICE parameter by using the information read from the setting part and the intermediate model expression read from the storage device; and
  outputting process variation dependency of the semiconductor circuit.

* * * * *